US008829597B2

(12) United States Patent
Kwak

(10) Patent No.: US 8,829,597 B2
(45) Date of Patent: Sep. 9, 2014

(54) NONVOLATILE MEMORY DEVICE AND METHOD FOR FABRICATING THE SAME

(71) Applicant: SK hynix Inc., Gyeonggi-do (KR)

(72) Inventor: Su-Chang Kwak, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,351

(22) Filed: Dec. 18, 2012

(65) Prior Publication Data
US 2014/0035025 A1 Feb. 6, 2014

(30) Foreign Application Priority Data

Aug. 2, 2012 (KR) .......................... 10-2012-0084758

(51) Int. Cl.
H01L 29/792 (2006.01)
H01L 27/115 (2006.01)
H01L 29/66 (2006.01)
(52) U.S. Cl.
CPC ........ H01L 29/792 (2013.01); H01L 27/11582 (2013.01); H01L 29/7926 (2013.01); H01L 29/66666 (2013.01); H01L 29/66833 (2013.01)
USPC ................... 257/324; 257/319; 257/E21.561; 257/E21.409; 257/E29.319; 438/257; 438/258; 438/259; 438/260; 438/261
(58) Field of Classification Search
USPC .................. 257/324, 319, E21.561, E21.409, 257/E29.309; 438/257–267, 591
See application file for complete search history.

(56) References Cited

U.S. PATENT DOCUMENTS

| 8,027,197 | B2* | 9/2011 | Shim et al. ................ 365/185.05 |
| 2010/0038699 | A1* | 2/2010 | Katsumata et al. ............ 257/324 |
| 2010/0109071 | A1* | 5/2010 | Tanaka et al. ................. 257/324 |
| 2010/0118610 | A1* | 5/2010 | Katsumata et al. ...... 365/185.18 |
| 2011/0031547 | A1* | 2/2011 | Watanabe ..................... 257/319 |
| 2012/0184078 | A1* | 7/2012 | Kiyotoshi ..................... 438/268 |

FOREIGN PATENT DOCUMENTS

KR 1020120100498 9/2012

* cited by examiner

Primary Examiner — Lex Malsawma
Assistant Examiner — Sheng Zhu
(74) Attorney, Agent, or Firm — IP & T Group LLP

(57) ABSTRACT

A nonvolatile memory device includes a plurality of channel connection layers formed over a substrate; a first gate electrode layer filling a space between the plurality channel connection layers; a gate dielectric layer interposed between each of the channel connection layers and the first gate electrode layer; a stacked structure formed over the plurality channel connection layers and the first gate electrode layer, the stacked structure including a plurality of interlayer dielectric layers and a plurality second gate electrode layers, which are alternately stacked; a pair of channel layers, formed through the stacked structure and connected to each channel connection layer of the plurality of channel connection layers; and a memory layer interposed between each of the channel layers and each of the second gate electrode layers.

16 Claims, 8 Drawing Sheets

US 8,829,597 B2

NONVOLATILE MEMORY DEVICE AND METHOD FOR FABRICATING THE SAME

CROSS-REFERENCE TO RELATED APPLICATIONS

The present application claims priority of Korean Patent Application No. 10-2012-0084758, filed on Aug. 2, 2012, which is incorporated herein by reference in its entirety.

BACKGROUND

1. Field

Exemplary embodiments of the present invention relate to a nonvolatile memory device and a method for fabricating the same, and more particularly, to a nonvolatile memory device having a 3D structure in which a plurality of memory cells are stacked along a channel protruding vertically from a substrate, and a method for fabricating the same.

2. Description of the Related Art

A nonvolatile memory device maintains data stored therein even though power supply is cut off. Currently, various nonvolatile memory devices such as a flash memory and the like are widely used.

Recently, as the improvement in integration degree of a 2D nonvolatile memory device, including memory cells formed as a signal layer over a silicon substrate, approaches a theoretical limit, a 3D nonvolatile memory device having a 3D structure, in which a plurality of memory cells are stacked along a channel protruding vertically from a silicon substrate, has been proposed.

FIG. 1 is a diagram illustrating a conventional nonvolatile memory device having a 3D structure.

Referring to FIG. 1, a first gate electrode 11, separated for each block, is disposed over a substrate 10. The first gate electrode layer 11 includes a plurality of island-shaped second holes H2 arranged therein. Over the first gate electrode layer 11, a stacked structure is disposed. The stacked structure includes a plurality of interlayer dielectric layers 13 and a plurality of second gate electrode layers 14 that are alternately stacked. The stacked structure includes a pair of first holes H1 connected to each of the second holes H2. The pair of first holes H1 and the second hole H2 form a hole having a U-shape. Furthermore, a memory layer 15 is formed along the inner walls of the first holes H1 and the second holes H2, and a channel layer 16 is buried in the first holes H1 and the second holes H2. Between the first holes H1, a slit S is disposed to separate the second gate electrode 14 between the first holes H1. Reference numerals 12 and 17 represent insulating materials.

The second gate electrode 14 is used as a gate electrode of a memory cell transistor. The channel layer 16 which is buried in any one of the pair of first holes H1, one second gate electrode 14, which is contacted with the channel layer 16, and the memory layer 15 between them form a unit memory cell. Memory cells formed along the channel layer 16 buried in one of the pair of first holes H1 are referred to as first substrings. Memory cells, formed along the channel layer 16 buried in another one of the pair of first holes H1, are referred to as second substrings. The first gate electrode 11 controls connections between the first substrings and the second substrings.

In the nonvolatile memory device of FIG. 1, the following process is required to form the first and second holes H1 and H2.

First, the first gate electrode layer 11 is formed. Then the first gate electrode 11 is etched to form and opening at a location corresponding to where the second hole H2 will be formed. An insulating material is deposited in the opening to form a sacrificial layer. Then, the stacked structure of the interlayer dielectric layers 13 and the second gate electrode layers 14 is etched to form the holes H1 and to expose the sacrificial layer. The exposed sacrificial layer is removed to form the second hole H2.

According to the above-described process, a method of forming the sacrificial layer and removing the sacrificial layer is used to form the second hole H2. Therefore, the process becomes complex. That is, a process of etching the first gate electrode 11 and a process of depositing an insulating material are required to form the sacrificial layer, and another etch process is then required to remove the sacrificial layer.

Furthermore, the sidewalls of the stacked structure exposed through the first holes H1 may be attacked during the process of removing the sacrificial layer to form the second hole H2, and the first and second holes H1 and H2 may lean.

Furthermore, since the memory layer 15 is formed along the inner walls of the first and second holes H1 and H2 after the first and second holes H1 and H2 are formed, the memory layer 15 may exist even in the second hole H2 in which the memory layer 15 is not necessary.

SUMMARY

An exemplary embodiment is directed to a nonvolatile memory device and a method for fabricating the same, which is capable of preventing a process defect, simplifying the process, and improving the characteristic of the device.

In accordance with an exemplary embodiment, a memory device may include: a plurality of channel connection layers formed over a substrate; a first gate electrode layer filling a space between the plurality channel connection layers; a gate dielectric layer interposed between each of the channel connection layers and the first gate electrode layer; a stacked structure formed over the plurality channel connection layers and the first gate electrode layer, the stacked structure including a plurality of interlayer dielectric layers and a plurality second gate electrode layers, which are alternately stacked; a pair of channel layers, formed through the stacked structure and connected to each channel connection layer of the plurality of channel connection layers; and a memory layer interposed between each of the channel layers and each of the second gate electrode layers.

In accordance with an exemplary embodiment, a method for fabricating a memory device may include: forming a plurality of channel connection layers over a substrate; forming a gate dielectric layer on surfaces of each of the channel connection layers; forming a first gate electrode layer to fill a space between the plurality of channel connection layers; forming a stacked structure over the plurality channel connection layers and the first electrode layer, the stacked structure including a plurality of interlayer dielectric layers and a plurality of second gate electrode layers, which are alternately stacked; forming, through the stacked structure, a pair of channel holes to expose each channel connection layer of the plurality of channel connection layers; and forming a memory layer and a channel layer in each channel hole of the pair of channel holes.

In accordance with an exemplary embodiment, a method for fabricating a memory device may include: forming a plurality of channel connection layers over a substrate; forming a gate dielectric layer on surfaces of each of the channel connection layers; forming a first gate electrode layer to fill a space between the plurality of channel connection layers; forming a stacked structure over the plurality of channel connection layers and the first gate electrode layer, the stacked structure including a plurality of interlayer dielectric layers and a plurality of sacrificial layers, which are alternately stacked; forming, through the stacked structure, a pair of channel holes to expose each channel connection layer of the plurality of channel connection layers; forming a channel layer in each channel hole of the pair of channel holes; replacing the sacrificial layers with second gate electrode layers; and forming a memory layer interposed between each of the channel layers and each of the second gate electrode layers.

DETAILED DESCRIPTION

Figure 1:
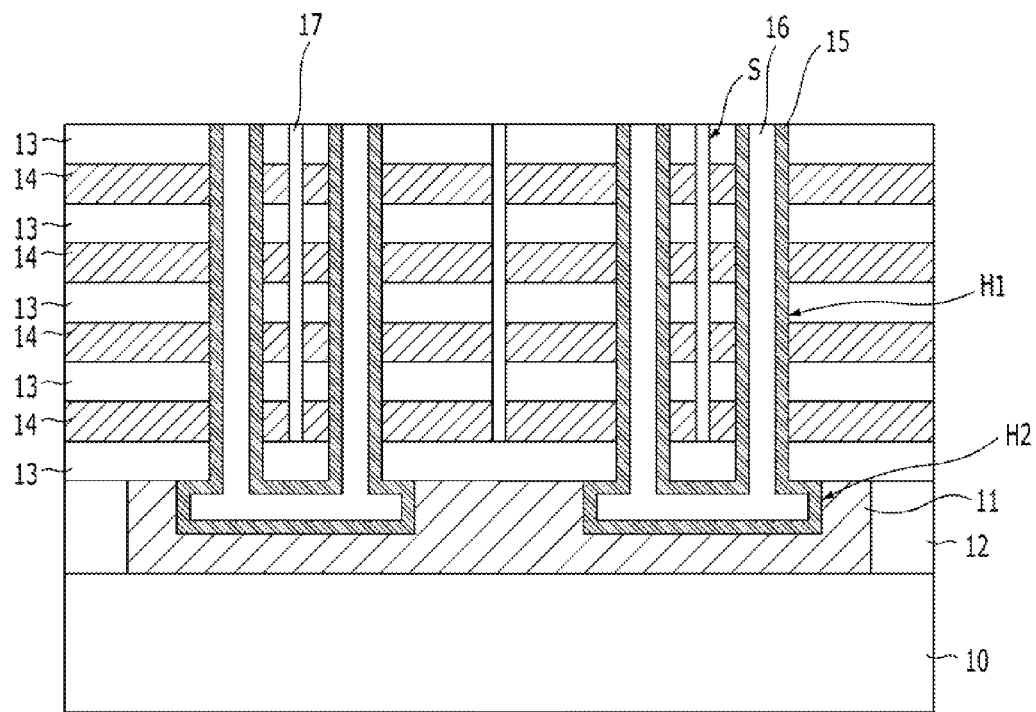
FIG. 1 is a diagram illustrating a conventional nonvolatile memory device having a 3D structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
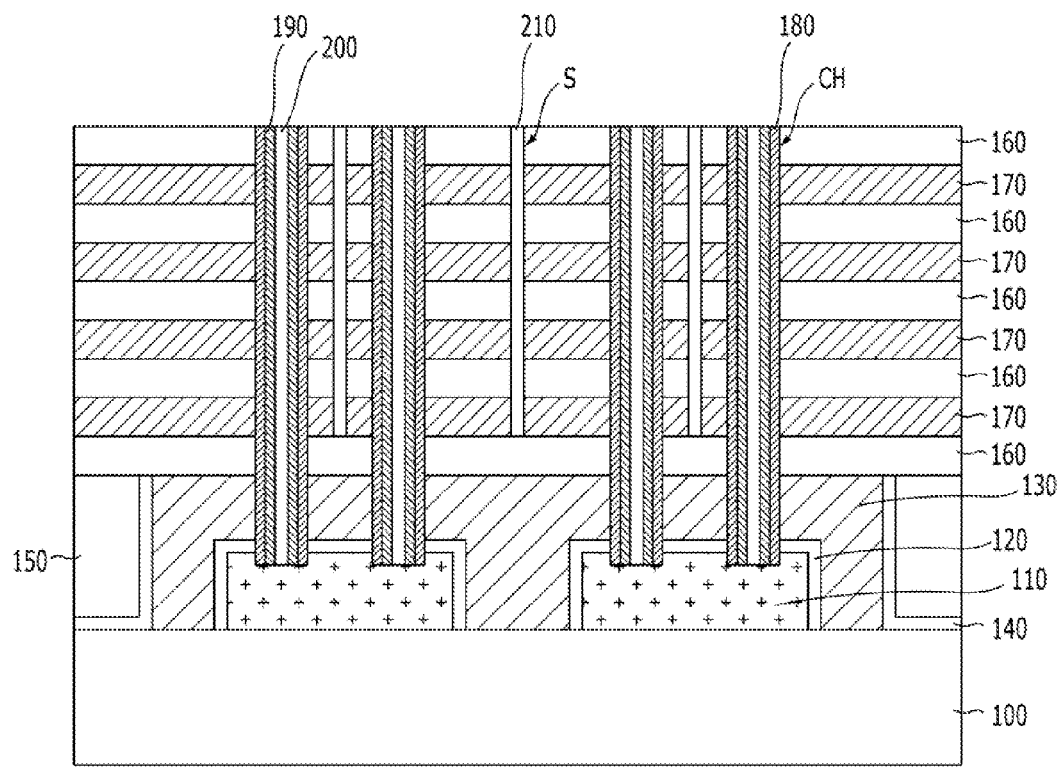
FIGS. 2 and 3 are diagrams illustrating a nonvolatile memory device in accordance with an exemplary embodiment.
Figure 3:
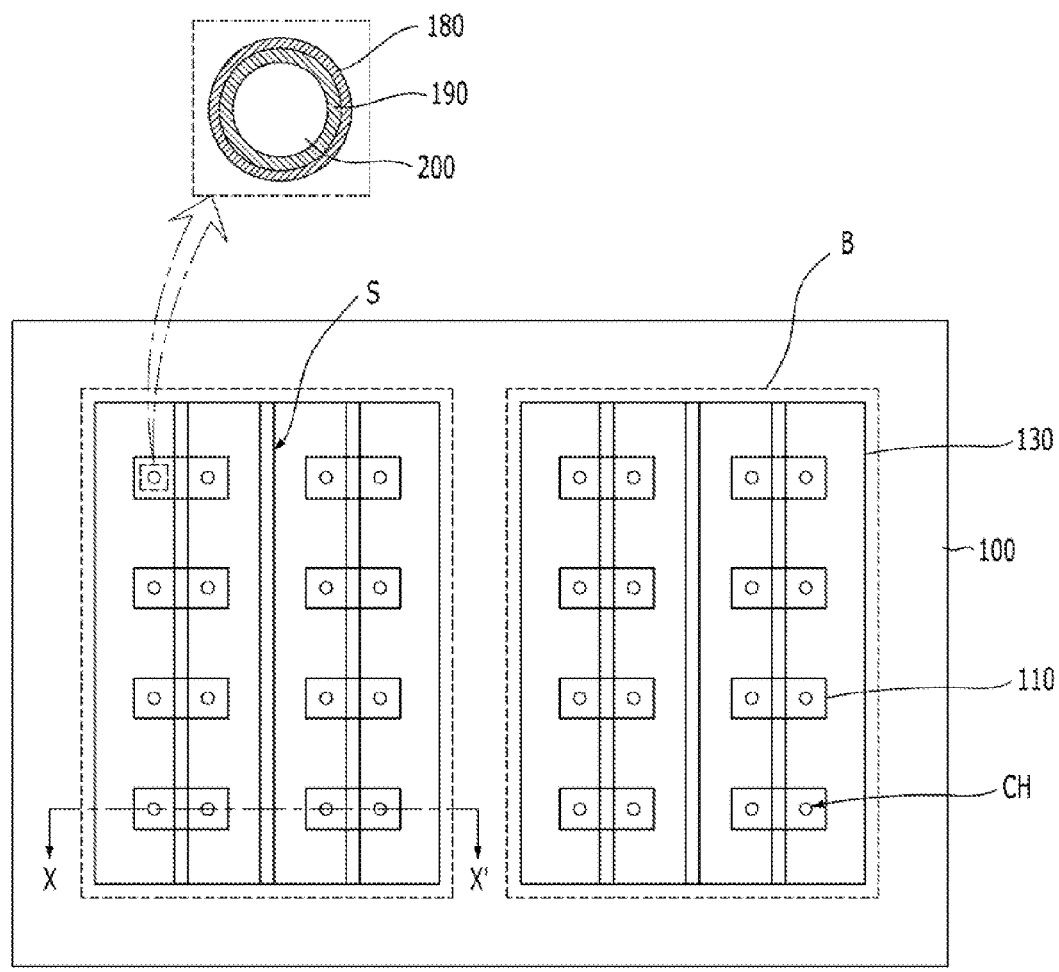

FIGS. 2 and 3 are diagrams illustrating a nonvolatile memory device in accordance with an exemplary embodiment. FIG. 2 is a cross-sectional view taken along line X-X' of FIG. 3, and FIG. 3 is a plan view of the nonvolatile memory device.

Referring to FIGS. 2 and 3, a substrate 100 is provided. The substrate 100 may include a semiconductor substrate such as a silicon substrate, and the present invention is not limited thereto. The substrate 100 may include an insulating layer (not illustrated) at the uppermost part thereof.

The substrate 100 defines a plurality of block areas B. FIG. 3 illustrates two block areas B, but the present invention is not limited thereto. The number of block areas B may be changed in various manners.

Each of the block areas B over the substrate 100 includes a plurality of channel connection layers 110 arranged therein. The channel connection layer 110 may be formed in an island shape, and may have a major axis in a direction parallel to line X-X' (hereafter, first direction) and a minor axis in a direction crossing line X-X' (hereafter, second direction). The channel connection layer 110 may be formed of a semiconductor material, for example, polysilicon. In this embodiment of the present invention, 2*4 channel connection layers 110 are arranged in each of the block areas B. However, an exemplary embodiment is not limited thereto, but the arrangement and number of channel layers 110 formed in each of the block areas B may be varied. Furthermore, in this exemplary embodiment, the channel connection layers 110 are arranged inside the block area B. However, an exemplary embodiment is not limited thereto, but the channel connection layers 110 may be contacted with the boundary of the block area B.

A first gate electrode layer 130 is disposed in each of the block areas B over the substrate 100. The first gate electrode layer 130 fills a portion of the block area B that is not occupied by the plurality of channel connection layers 110. One first gate electrode layer 130 is disposed in each of the block areas B, and the first gate electrode layer 130 of any one block area B is isolated from the first gate electrode layer 130 of another block area B. In an exemplary embodiment, the first gate electrode layer 130 is formed to not only fill the space between the channel connection layers 110, but also cover the top surfaces of the channel connection layers 110. However, an exemplary embodiment is not limited thereto. In an alternative embodiment, the first gate electrode layer 130 may have a thickness that does not cover the top surfaces of the channel connection layers 110. That is, the first gate electrode layer 130 may only fill the space between the channel connection layers 110, so as to be contacted with all of the channel connection layers 110 of the corresponding block area B. When the first gate electrode layer 130 covers the top surfaces of the channel connection layers 110, the contact area between the channel connection layers 110 and the first gate electrode layer 130 is larger than when the first gate electrode layer 130 does not cover the top surfaces of the channel connection layers 110. Therefore, it becomes easy to control the channel connection layers 110. The first gate electrode layer 130 may be formed of a conductive material, for example, impurity-doped polysilicon.

The space between the first gate electrodes 130 is filled with an insulating material. For example, the space may be filled with first and second insulating layers 140 and 150.

A gate dielectric layer 120 is interposed between the channel connection layer 110 and the first gate electrode layer 130. The gate dielectric layer 120 may include an oxide, for example.

Furthermore, a stacked structure is disposed over the first gate electrode 130 and the first and second insulating layers 140 and 150. The stacked structure includes a plurality of interlayer dielectric layers 160 and second gate electrode layers 170 that are alternately stacked. The second gate electrode layers 170 serve as gate electrodes, of a memory cell, and may be formed of a conductive material such as impurity-doped polysilicon or metal, for example. An uppermost second gate electrode layer 170, of the second gate electrode layers 170, may serve as a gate electrode of a select transistor. The interlayer dielectric layers 160 serves to insulate the respective second gate electrodes 170 from each other, and may be formed of an oxide.

Inside the stacked structure, including the interlayer dielectric layers 160 and the second gate electrode layers 170, a pillar-shaped channel layer 190 is disposed to be connected to the channel connection layer 110 through the stacked structure. In this exemplary embodiment, since the first gate electrode layer 130 and the gate insulating layer 120 are arranged between the channel connection layer 110 and the stacked structure, the channel layer 190 is formed through the first gate electrode layer 130 and the gate dielectric layer 120 as well as the stacked structure. As shown FIG. 2, a pair of channel layers 190 are connected to each of the channel connection layers 110. The pair of channel layers 190 may be arranged in parallel to each other in the major-axis direction of the channel connection layer 110. The channel layer 190 may be formed of a semiconductor material, for example, polysilicon.

In an exemplary embodiment, the channel layer 190 may be formed in a cylindrical shape having an empty space therein. The empty space in the channel layer 190 may be filled with an insulating material 200. In an alternative embodiment, a pillar-shaped channel layer having no empty space may be formed, and the insulating material 200 may be omitted.

In an exemplary embodiment, the outer surface of the channel layer 190 may be surrounded by a memory layer 180, but an exemplary embodiment is not limited thereto. As long as the memory layer 180 is interposed between the second gate electrode layers 170 and the channel layer 190, the shape of the memory layer 180 may be varied. The memory layer 180 may have a triple-layer structure of a tunnel insulating layer, a charge trapping layer, and a charge blocking layer that are sequentially arranged. For example, the memory layer 180 may include an oxide-nitride-oxide (ONO) layer.

Between the pair of channel layers 190 that are connected to the same channel connection layer 110, the second gate electrode layers 170 may each be separated into two parts. A slit S is formed between the pair of channel layers 190 so as to pass through at least the lowermost of the second gate electrode layers 170. Furthermore, the second gate electrode layers 170 located between the adjacent channel layers 190 and connected to different channel connection layers 100 may also be separated. Thus, a slit S may also be formed between the adjacent channel layers 190. The slit S may have a line shape extended in the second direction.

The slit S may be filled with an insulating material 210, such as an oxide.

Any one of the pair of channel layers 190 may be connected to a bit line (not illustrated), and another one of the pair of channel layers may be connected to a source line (not illustrated).

Hereinafter, methods for fabricating the above-described device will be described.

Figure 4:
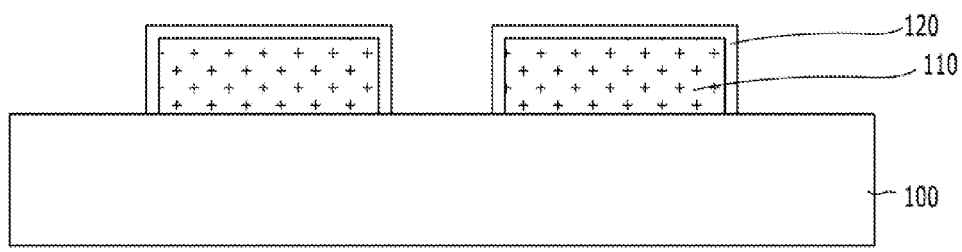
FIGS. 4 to 6 are diagrams illustrating intermediate processes for fabricating the device of FIGS. 2 and 3.
Figure 5:
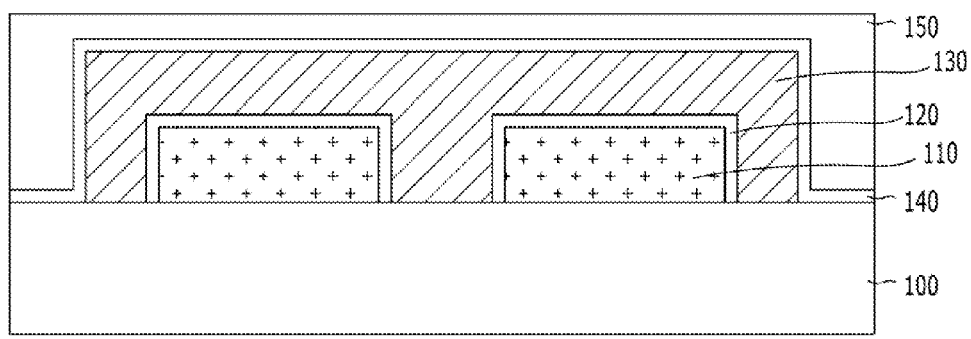
Figure 6:
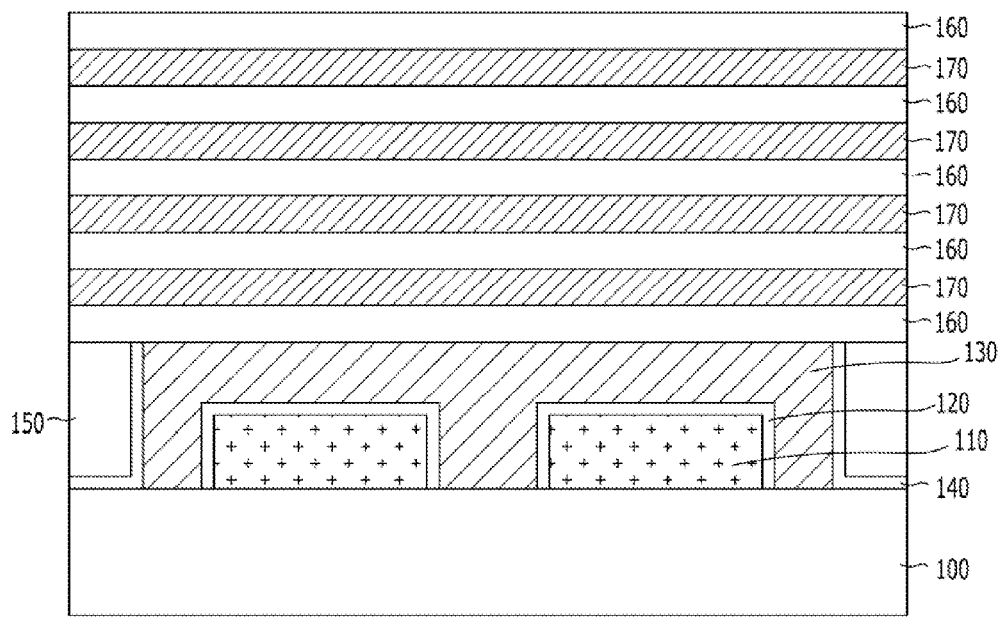

FIGS. 4 to 6 are diagrams illustrating intermediate processes for fabricating the device of FIGS. 2 and 3. FIGS. 4 to 6 are cross-sectional views taken along line X-X' of FIG. 3.

Referring to FIG. 4, a plurality of channel connection layers 110 are formed over a substrate 100. The channel connection layers 110 may be formed by depositing a semiconductor material on the substrate 100 and selectively etching the deposited semiconductor material.

Then, a gate dielectric layer 120 is formed on the surface of the channel connection layer 110. The gate dielectric layer 120 may include an oxide layer formed by an oxidation process for the channel connection layer 110.

Referring to FIG. 5, a conductive material is deposited on the substrate 100 having the gate dielectric layer 120 formed therein, and selectively etched to form a first gate electrode layer 130 separated for each block. At this time, the conductive material may be formed to such a thickness so as to cover the gate dielectric layer 120. In an alternative exemplary embodiment, the conductive material may be formed to such a thickness so as not to cover the gate dielectric layer 120.

Then, a first insulating layer 140 is formed along the entire surface of the resultant structure, including the first gate electrode layer 130, and a second insulating layer 150 is formed over the first insulating layer 140. The first insulating layer 140 may include nitride, and the second insulating layer 150 may include oxide, for example.

Referring to FIG. 6, a planarization process, for example, chemical mechanical process (CMP) is performed on the resultant structure of FIG. 5 until the first insulating layer 140 is exposed, and the first insulating layer 140 is then removed. As a result, the surface of the first gate electrode layer 130 is exposed, and the first and second insulating layers 140 and 150, having an even surface with respect to the first gate electrode layer 130, are buried in the space between first gate electrode layers 130. The structure including of the substrate 100, the channel connection layer 110, the first gate electrode layer 130, the first insulation layer 140, the second insulation layer 150, is referred to as the lower structure.

Then, a stacked structure is formed on the lower structure by alternately depositing a plurality of interlayer dielectric layers 150 and second gate electrode layers 170 on the first gate electrode layer and the first and second insulating layers 140 and 150.

Referring to FIGS. 2 and 3, a plurality of channel holes CH are formed by selectively etching the stacked structure and the lower structure until the channel connection layer 110 is exposed. A pair of channel holes CH may be formed for each of the channel connection layers 110.

A memory layer 180 is formed on sidewalls of the channel holes CH. The memory layer 180 may be formed by sequentially depositing a charge blocking layer, a charge trapping layer, and a tunnel insulating layer along the entire surface of the stacked structure and the lower structure that defines the channel hole CH, depositing a protective layer, formed of nitride, on the tunnel insulating layer, removing the protective layer from a bottom surface of the channel hole CH through a blanket etch process or the like, and removing the charge blocking layer, the charge trapping layer, and the tunnel insulating layer that have been exposed by the removal of the protective layer.

A channel layer 190 is formed in the channel hole CH on the memory layer 180. The channel layer 190 may be formed by depositing a semiconductor material on an entire surface of the memory layer 180. In an exemplary embodiment, FIGS. 2 and 3 illustrate that the channel layer 190 is formed only on the sidewalls of the channel hole CH. However, in an alternative exemplary embodiment the channel layer 190 may be formed on the bottom surface of the channel hole CH. Furthermore, the channel layer 190 has such a thickness so as not to fill the entire channel hole CH. However, in an alternative exemplary embodiment, the channel layer 190 may have such a thickness so as to fill the entire hole CH having the memory layer 180 formed therein.

An insulating material 200 may be formed to fill a space defined in the channel hole CH by the channel layer 190. If the entire channel hole CH is filled with the channel layer 190, the formation process of the insulating material 200 may be omitted.

The stacked structure, formed of the interlayer dielectric layers 160 and the second gate electrode layers 170, between channel holes CH is selectively etched to form a slit S to such a depth as to pass through at least the lowermost second gate electrode 170.

The slit S is filled with an insulating material.

Subsequent processes, for example, a process of forming a bit line connected to any one of the pair of channel layers 190 and a processes of forming a source line connected to the other of the pair of channel layers 190 are well known to those skilled in the art. Therefore, the detailed descriptions thereof are omitted.

Figure 7:
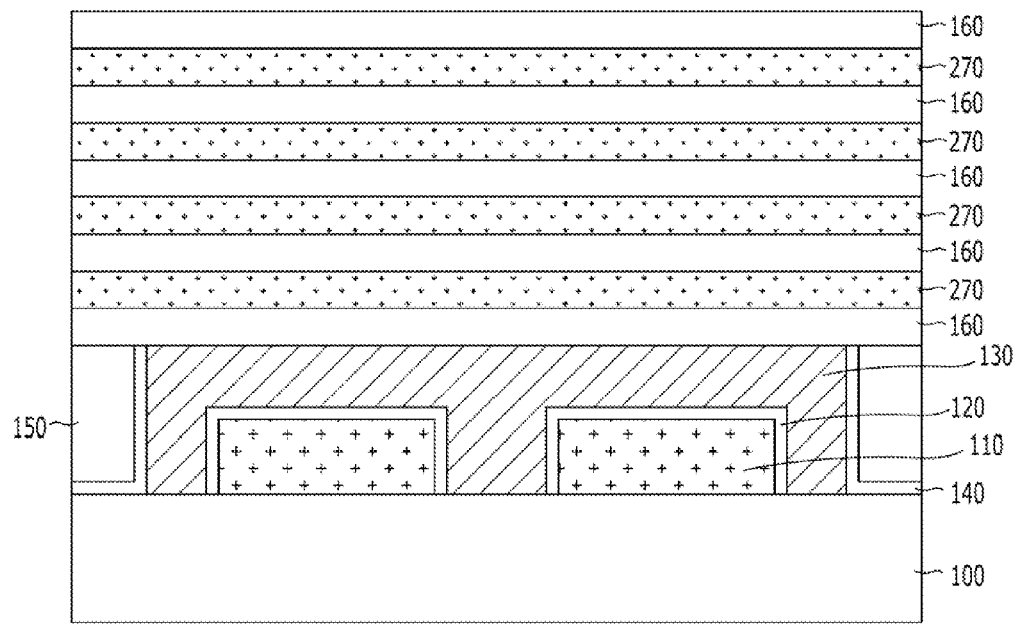
FIGS. 7 to 9 are diagrams illustrating another example of the intermediate processes for fabricating the device of FIGS. 2 and 3.
Figure 8:
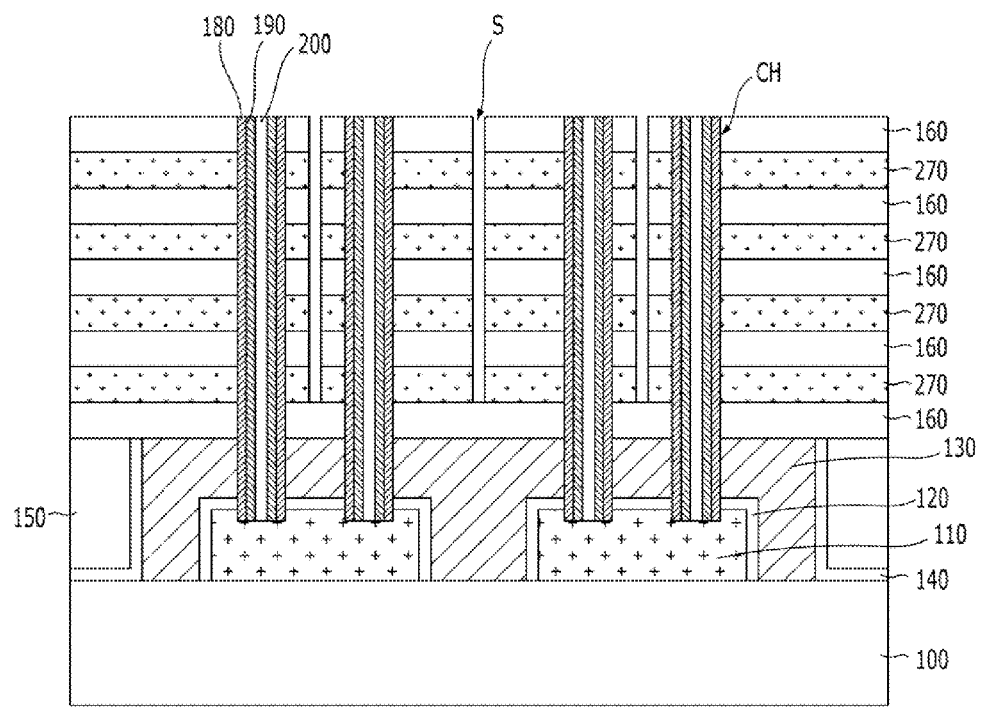
Figure 9:
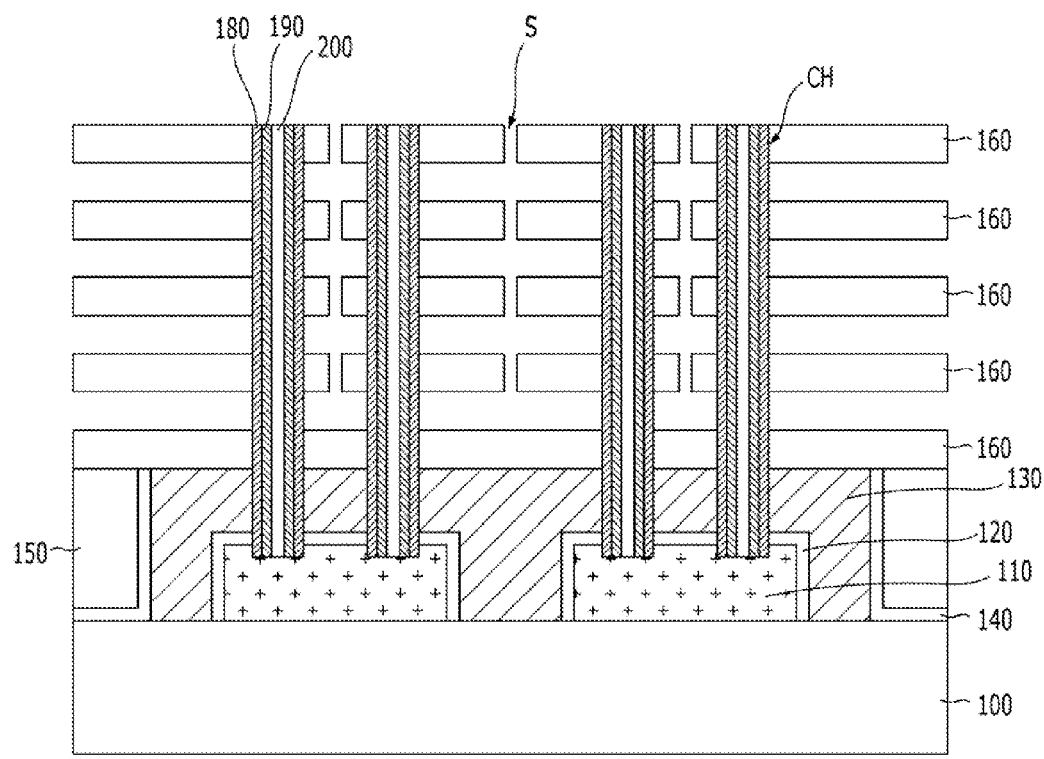

FIGS. 7 to 9 are diagrams illustrating an exemplary embodiment for fabricating the device of FIGS. 2 and 3. FIGS. 7 to 9 are cross-sectional views taken along line X-X' of FIG. 3.

Referring to FIG. 7, a channel connection layer 110, a gate dielectric layer 120, a first gate electrode layer 130 and first and second insulating layers 140 and 150 are formed over the substrate 100. Since the formation processes are performed in the same manner as those described above, the detailed descriptions thereof are omitted.

A stacked structure is formed by alternately depositing a plurality of interlayer dielectric layers 160 and sacrificial layers 270 over the first electrode layer 130 and the first and second insulating layers 140 and 150. The plurality of sacrificial layers 270 may be formed of a material, such as a nitride, having an etch rate that is different from an etch rate of the interlayer dielectric layers 160. The plurality of sacrificial layers 270 are removed through a subsequent process to provide a plurality of spaces in which a plurality of second gate electrode layers are to be formed.

Referring to FIG. 8, a plurality of channel holes CH are formed by selectively etching the stacked structure and the lower structure thereof until the channel connection layer 110 is exposed. A pair of channel holes CH are formed for each channel connection layer 110.

Subsequently, a memory layer 180 is formed on the sidewalls of the channel holes CH. A channel layer 190 is formed in the channel hole CH on the memory layer 180. Then, an insulating material 200 is formed to fill the rest space of the channel hole CH. In an alternative embodiment, an insulating layer, such as an oxide layer, may be formed instead of the memory layer 180, or the memory layer 180 may be omitted.

The stacked structure of the interlayer dielectric layers 160 and the sacrificial layers 270, between the channel holes CH, is selectively etched to form a slit S passing through at least the lowermost sacrificial layer 270.

Referring to FIG. 9, the sacrificial layers 270 exposed by the slit S are removed. The removal of the sacrificial layer 270 may be performed by a wet etch process, for example.

Referring to FIGS. 2 and 3, a plurality of second gate electrode layers 170 are formed by burying a conductive material in spaces formed by the removal of the sacrificial layers 270. When the insulating layer is formed instead of the memory layer 180, or the memory layer 180 is omitted, a memory layer (not shown) is along the inner walls of the spaces from which the sacrificial layers 270 were removed, and then the second gate electrode layers 170 may be formed. That, is because the memory layer may be formed between the second electrode layer 170 and the channel layer 190, as described above.

Then, the slit S is filled with an insulating material 200, and well-known subsequent processes are performed.

In accordance with an exemplary embodiment since the channel connection layer 110 is formed first, the U-shaped channel including the pair of channel layers 190 and the channel connection layer 110 connecting the channel layers 190 may be formed without using a complex process for forming a U-shaped hole as in the conventional method.

Furthermore, since a process of forming a bottom hole connecting the channel holes CH is not needed because of the existence of the channel connection layer 110, it is possible to prevent problems occurring during the formation process of the bottom hole in the conventional method, such as attack or leaning of the holes.

Furthermore, after the channel connection layer 110 is formed, the gate dielectric layer 120 may be formed on the surface of the channel connection layer 110 through an oxidation process, for example. In other words, an unnecessary memory layer is not interposed between the first gate electrode 130 and the channel connection layer 110. Since the gate dielectric layer 120 may be formed separately from the memory layer, the type and thickness of the gate dielectric layer 120 may be controlled separately from the memory layer. Accordingly, it is possible to improve the characteristic of the device.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a plurality of channel connection layers formed over a substrate;
   a first gate electrode layer surrounding side surfaces and top surfaces except for bottom surfaces of the plurality channel connection layers;
   a gate dielectric layer interposed between each of the channel connection layers and the first gate electrode layer;
   a stacked structure formed over the first gate electrode layer, the stacked structure including a plurality of interlayer dielectric layers and a plurality second gate electrode layers, which are alternately stacked;
   a pair of channel layers connected to each channel connection layer of the plurality of channel connection layers through the stacked structure and the first gate electrode layer; and
   a memory layer interposed between each of the channel layers and each of the second gate electrode layers and between each of the channel layers and the first gate electrode layer.

2. The memory device of claim 1, where the first gate electrode layer is separated for each block.

3. The memory device of claim 1, where the memory layer and the gate dielectric layer are formed of different materials.

4. The memory device of claim 1, further comprising:
   a slit positioned between the channel layers, the slit being formed through the plurality of second gate electrode layers.

5. A method for fabricating a memory device, the method comprising:
   forming a plurality of channel connection layers over a substrate;
   forming a gate dielectric layer on surfaces of each of the channel connection layers;
   forming a first gate electrode layer surrounding side surfaces and top surfaces except for bottom surfaces of the plurality channel connection layers;
   forming a stacked structure over the first gate electrode layer, the stacked structure including a plurality of interlayer dielectric layers and a plurality of second gate electrode layers, which are alternately stacked;
   forming a pair of channel holes to expose each channel connection layer of the plurality of channel connection layers through the stacked structure and the first gate electrode layer; and
   forming a memory layer and a channel layer on a sidewall of each channel hole of the pair of channel holes.

6. The method of claim 5, where forming the gate dielectric layer comprises:
   performing an oxidation process on the plurality of channel connection layers.

7. The method of claim 5, where forming the first gate electrode layer comprises:

forming a conductive material over the substrate; and
etching the conductive material to separate the conductive material for each block.

8. The method of claim 5, where memory layer and the gate dielectric layer are formed of different materials.

9. The method of claim 5, further comprising:
forming, through the plurality of second gate electrodes, a slit positioned between the channel holes.

10. A method for fabricating a memory device, the method comprising:
forming a plurality of channel connection layers over a substrate;
forming a gate dielectric layer on surfaces of each of channel connection layers;
forming a first gate electrode layer surrounding side surfaces and top surfaces except for bottom surfaces of the plurality channel connection layers;
forming a stacked structure over the first gate electrode layer, the stacked structure including a plurality of interlayer dielectric layers and a plurality of sacrificial layers, which are alternately stacked;
forming a pair of channel holes to expose each channel connection layer of the plurality of channel connection layers through the stacked structure and the first gate electrode layer;
forming a channel layer on a sidewall of each channel hole of the pair of channel holes;
replacing the sacrificial layers with second gate electrode layers; and
forming a memory layer interposed between each of the channel layers and each of the second gate electrode layers.

11. The method of claim 10, where forming the gate dielectric layer comprises:
oxidizing the plurality of channel connection layers.

12. The method of claim 10, where forming the first gate electrode layer comprises:
forming a conductive material over the substrate; and
etching the conductive material to separate the conductive material for each block.

13. The method of claim 10, where the memory layer and the gate dielectric layer are formed of different materials.

14. The method of claim 10, where replacing the sacrificial layers comprises:
forming, through the plurality of sacrificial layers, a slit positioned between the channel holes;
removing the plurality of sacrificial layers exposed through the slit; and
burying a conductive material in spaces formed by the removal of the plurality of sacrificial layers.

15. The method of claim 14, where forming the memory layer comprises:
forming the memory layer along the inner walls of the spaces from which the sacrificial layers were removed, after the removing the plurality of sacrificial layers and before the burying of the conductive material.

16. The method of claim 10, where forming the memory layer comprises:
forming the memory layer on sidewalls of the channel holes before forming the channel layer.

* * * * *